(12) United States Patent
Koyanagi (10) Patent No.: US 7,085,799 B2
(45) Date of Patent: Aug. 1, 2006

(54) ANALOG FILTER SUITABLE FOR SMOOTHING A ΔΣ-MODULATED SIGNAL

(75) Inventor: Yukio Koyanagi, Saitama (JP)

(73) Assignee: Yasue Sakai, Saitama (JP)

( * ) Notice: Subject to any disclaimer, the term of this patent is extended or adjusted under 35 U.S.C. 154(b) by 725 days.

(21) Appl. No.: 10/203,004

(22) PCT Filed: Dec. 6, 2001

(86) PCT No.: PCT/JP01/10670

§ 371 (c)(1),
(2), (4) Date: Aug. 5, 2002

(87) PCT Pub. No.: WO02/47296

PCT Pub. Date: Jun. 13, 2002

(65) Prior Publication Data

US 2003/0014460 A1    Jan. 16, 2003

(30) Foreign Application Priority Data

Dec. 7, 2000    (JP) ............................. 2000-372222

(51) Int. Cl.
*G06G 7/02* (2006.01)
(52) U.S. Cl. .................................................. 708/819
(58) Field of Classification Search ................ 708/819
See application file for complete search history.

(56) References Cited

U.S. PATENT DOCUMENTS 3,979,701 A * 9/1976 Tomozawa .................. 333/166
4,528,598 A * 7/1985 Trytko et al. .................. 386/2
5,023,821 A * 6/1991 Argintaru et al. ............... 708/3
5,790,439 A * 8/1998 Yamanaka et al. .......... 708/316
6,035,320 A * 3/2000 Kiriaki et al. .............. 708/819

FOREIGN PATENT DOCUMENTS

| JP | 63211912 A | 9/1988 |
|---|---|---|
| JP | 05055875 A | 3/1993 |
| JP | 08-330957 | 12/1996 |
| JP | 10233687 A | 9/1998 |
| JP | 2000307428 A | 11/2000 |
| WO | WO-0068826 | 11/2000 |

* cited by examiner

*Primary Examiner*—Tan V. Mai
(74) *Attorney, Agent, or Firm*—Connolly Bove Lodge & Hutz LLP; Larry J. Hume (57) ABSTRACT

An analog filter includes a first arithmetic operation section $2_{-1}$ having a plurality of sets of processing circuit being cascade connected, each processing circuit having an S/H circuit of plural stages for holding a ΔΣ-modulated signal and an analog adder for adding the input and output signals of the S/H circuit, in which the number of stages of the S/H circuits $11_{-1}$, $14_{-1}$, $17_{-1}$ and $20_{-1}$ decreases toward the end of cascade connection, and a second arithmetic operation section $2_{-2}$ configured in the same way, which are cascade connected. By using such an analog filter, over sampling and convolution of a ΔΣ-modulated signal are conducted so that the envelope of the filter output may be a quadratic curve of finite carrier that converges to zero at finite sampling points to prevent phase distortion of an LPF and a discretization error due to a conventional function. Compared with a conventional circuit for over-sampling and convolution, the number of stages of the S/H circuits and the number of adders are small.

4 Claims, 9 Drawing Sheets

F I G. 1

FIG. 2A FIRST CONVOLUTION OPERATION

FIG. 2B SECOND CONVOLUTION OPERATION

FIG. 2C THIRD CONVOLUTION OPERATION

| DATA | CLOCK | OPERATION | t1 | t2 | t3 | t4 | t5 | t6 | t7 |
|---|---|---|---|---|---|---|---|---|---|
| | | | a | b | c | d | e | f | g |
| MAIN DATA | Fs | FIFO | | | | a | b | c | d | e |
| SUB- DATA 1 | Fs | WRITE | a | | | | e | | |
| | 2Fs | READ | | a \| a | INH | a \| a | | e \| e | INH |
| SUB- DATA 2 | Fs | WRITE | | b | | | | f | |
| | 2Fs | READ | | | b \| b | INH | b \| b | | f \| f |
| SUB- DATA 3 | Fs | WRITE | | | c | | | | g |
| | 2Fs | READ | | | | c \| c | INH | c \| c | |
| SUB- DATA 4 | Fs | WRITE | | | | d | | | |
| | 2Fs | READ | | | | | d \| d | INH | d \| d |

ANALOG FILTER SUITABLE FOR SMOOTHING A ΔΣ-MODULATED SIGNAL

BACKGROUND OF THE INVENTION

1. Field of the Invention

The present invention relates to an analog filter that is suitably used as a filter for smoothing a ΔΣ-modulated signal, for example.

2. Description of the Related Art

A ΔΣ-modulation is a method for encoding an analog signal with a variation in the data for the immediately preceding data at each sampling point sampled at each timing of a predetermined sampling frequency in converting an analog signal into a digital signal. That is, the ΔΣ-modulation represents an amplitude component of the analog signal in binary value (one bit) alone.

This ΔΣ-modulation is employed for encoding an audio signal, for example. The ΔΣ-modulation method has the merits that the overall constitution can be simplified as compared with the PCM method for the CD (Compact Disk) widely used at present, and the restorability from the digital signal to the original analog signal can be enhanced by controlling the distribution of quantization noise.

That is, in the PCM method, the analog signal is replaced with the digital signal by making an arithmetic operation based on the quantization characteristic at each timing of the sampling frequency, and the absolute amount of data are recorded at all the sampling points. On the contrary, in the ΔΣ-modulation method, a variation in the data for the immediately preceding data is only recorded, and no thinning or interpolation of information amount is made, unlike the PCM method, whereby the binary signal produced by quantization presents a characteristic quite close to analog characteristic.

Accordingly, in the case of reproducing the digital signal encoded on the basis of the ΔΣ-modulation method, the original analog signal can be reproduced by making a simple process of removing high frequency components of the digital signal through a low pass filter provided at the last stage, without need for a D/A converter, unlike the PCM method. In practice, in the conventional audio reproducing apparatus, the original analog signal was reproduced by passing the ΔΣ-modulated signal through the low pass filter.

However, when the low pass filter was used, there was a problem that the output waveform was distorted due to a phase distortion of the low pass filter. Another method is conceived in which an interpolation process with the sinc function is made by applying an over-sampling technique currently employed for the CD and so on. However, since this sinc function converges to zero toward ±∞, a discretization error occurs in the arithmetic operation and a distorted output waveform is produced. Also, there was another problem that the constitution was quite complex.

The present invention has been achieved to solve the above-mentioned problems, and it is an object of the invention to provide an analog filter optimal for the ΔΣ-modulated output. Specifically, the invention is aimed at providing an analog filter with less distortion in the output waveform and of a simple constitution.

SUMMARY OF THE INVENTION

The present invention provides an analog filter for performing over-sampling and moving average operation or convolution operation on individual ΔΣ-modulated discrete data to perform interpolation so that the envelope of the output waveform may be a quadratic curve passing the sample values of individual ΔΣ-modulated discrete data, wherein a plurality of sets of processing circuit are cascade connected, each set of processing circuit, comprising a sample hold circuit of plural stages for holding a signal, and an adder for adding the input and output signals of the sample hold circuit of plural stages and the number of stages of the sample hold circuit of plural stages for the plurality of sets of processing circuit being different.

In this analog filter, the number of stages of the sample hold circuit of plural stages provided for the plurality of sets of processing circuit decreases toward the end of the cascade connection.

This invention further provides an analog filter comprising a first arithmetic operation section for performing moving average operation or convolution operation on individual ΔΣ-modulated discrete data to perform interpolation so that the envelope of the output waveform may be a symmetrical trapezoidal wave, and a second arithmetic operation section for performing moving average operation or convolution operation on individual discrete data of the symmetrical trapezoidal wave obtained in the first arithmetic operation section to perform interpolation, so that the envelope of the output waveform may be a quadratic curve wave passing the sample values of individual ΔΣ-modulated discrete data, wherein each of the first arithmetic operation section and the second arithmetic operation section has a circuit composed of a sample hold circuit of plural stages for holding a signal, and an adder for adding the input and output signals of the sample hold circuit of plural stages as one set of processing circuit, a plurality of sets of processing circuit being cascade connected, and the number of stages of the sample hold circuit of plural stages provided for the plurality of sets of processing circuit being different.

This invention still further provides an analog filter comprising a first arithmetic operation section for performing moving average operation or convolution operation on individual ΔΣ-modulated discrete data to perform interpolation so that the envelope of the output waveform may be a symmetrical trapezoidal wave, and a second arithmetic operation section for performing moving average operation or convolution operation on individual discrete data of the symmetrical trapezoidal wave obtained in the first arithmetic operation section to perform interpolation so that the envelope of the output waveform may be a quadratic curve wave passing the sample values of individual ΔΣ-modulated discrete data, wherein each of the first arithmetic operation section and the second arithmetic operation section has a circuit composed of a sample hold circuit of plural stages for holding a signal, an adder for adding the input and output signals of the sample hold circuit of plural stages, and a ½ divider for dividing by two the output signal of the adder, as one set of processing circuit, a plurality of sets of processing circuit being cascade connected, and the number of stages of the sample hold circuit of plural stages provided for the plurality of sets of processing circuit being different.

In the analog filter, the number of stages of the sample hold circuit of plural stages provided for the plurality of sets of processing circuit decreases toward the end of the cascade connection in each of the first arithmetic operation section and the second arithmetic operation section.

The analog filter further comprises a preprocessing section for preprocessing individual ΔΣ-modulated discrete data according to a digital fundamental waveform that is the basis of a sampling function of finite carrier that converges to zero at finite sampling points to conduct the moving average operation or convolution operation on the output signal of the preprocessing section.

This invention further provides an analog filter comprising a first arithmetic operation section having a circuit composed of a sample hold circuit of $2^i$ stages for holding a signal, and an adder for adding the input and output signals of the sample hold circuit of $2^i$ stages, as one set of processing circuit, j sets of processing circuit being cascade connected, the number of stages of the sample hold circuit of $2^i$ stages provided for the j sets of processing circuit being $i=j-1, j-2, \ldots, 1, 0$, and a second arithmetic operation section configured in the same way as the first arithmetic operation section, wherein the first arithmetic operation section and the second arithmetic operation section are cascade connected.

The invention further provides an analog filter comprising a first arithmetic operation section having a circuit composed of a sample hold circuit of $2^i$ stages for holding a signal, an adder for adding the input and output signals of the sample hold circuit of $2^i$ stages, and a ½ divider for dividing by two the output signal of the adder, as one set of processing circuit, j sets of processing circuit being cascade connected, the number of stages of the sample hold circuit of $2^i$ stages provided for the j sets of processing circuit being $i=j-1, j-2, \ldots, 1, 0$, and a second arithmetic operation section configured in the same way as the first arithmetic operation section, wherein the first arithmetic operation section and the second arithmetic operation section are cascade connected.

The analog filter further comprises a sample hold circuit of one stage for holding an output signal of the second arithmetic operation section, an adder for adding the input and output signals of the sample hold circuit of one stage, and a ½ divider for dividing by two the output signal of the adder.

The invention further provides an analog filter comprising a preprocessing section for preprocessing individual $\Delta\Sigma$-modulated discrete data according to a digital fundamental waveform that is the basis of a sampling function of finite carrier that converges to zero at finite sampling points, a first arithmetic operation section having a circuit composed of a sample hold circuit of $2^i$ stages for holding a signal, and an adder for adding the input and output signals of the sample hold circuit of $2^i$ stages, as one set of processing circuit, j sets of processing circuit being cascade connected, the number of stages of the sample hold circuit of $2^i$ stages provided for the j sets of processing circuit being $i=j-1, j-2, \ldots, 1, 0$, and a second arithmetic operation section configured in the same way as the first arithmetic operation section, wherein the first arithmetic operation section and the second arithmetic operation section are cascade connected.

This invention is composed of the technical means as above, in which over-sampling and the moving average or convolution operation are conducted to interpolate the $\Delta\Sigma$-modulated discrete data so that the envelope of the filter output may be a sampling function of finite carrier that converges to zero at finite sampling points to prevent phase distortion of a low pass filter and a discretization error due to the sinc function and produce a smooth analog signal with less distortion in the output waveform. Accordingly, if the analog filter of the invention is applied to the acoustic equipment, the sound quality can be conspicuously enhanced as compared with the conventional acoustic equipment.

With this invention, as compared with a conventional circuit for the moving average operation or convolution operation, the number of stages of the sample hold circuits and the number of adders can be significantly reduced, thereby simplifying the configuration.

DETAILED DESCRIPTION OF THE PREFERRED EMBODIMENTS

The preferred embodiments of the present invention will be described below with reference to the accompanying drawings.

First Embodiment

An analog filter according to a first embodiment of the invention provides an analog signal having a smoother and less distorted waveform by over-sampling in certain times, and performing the moving average or convolution operation (hereinafter referred to as convolution) on individual $\Delta\Sigma$-modulated binary signal (one bit).

Figure 1:
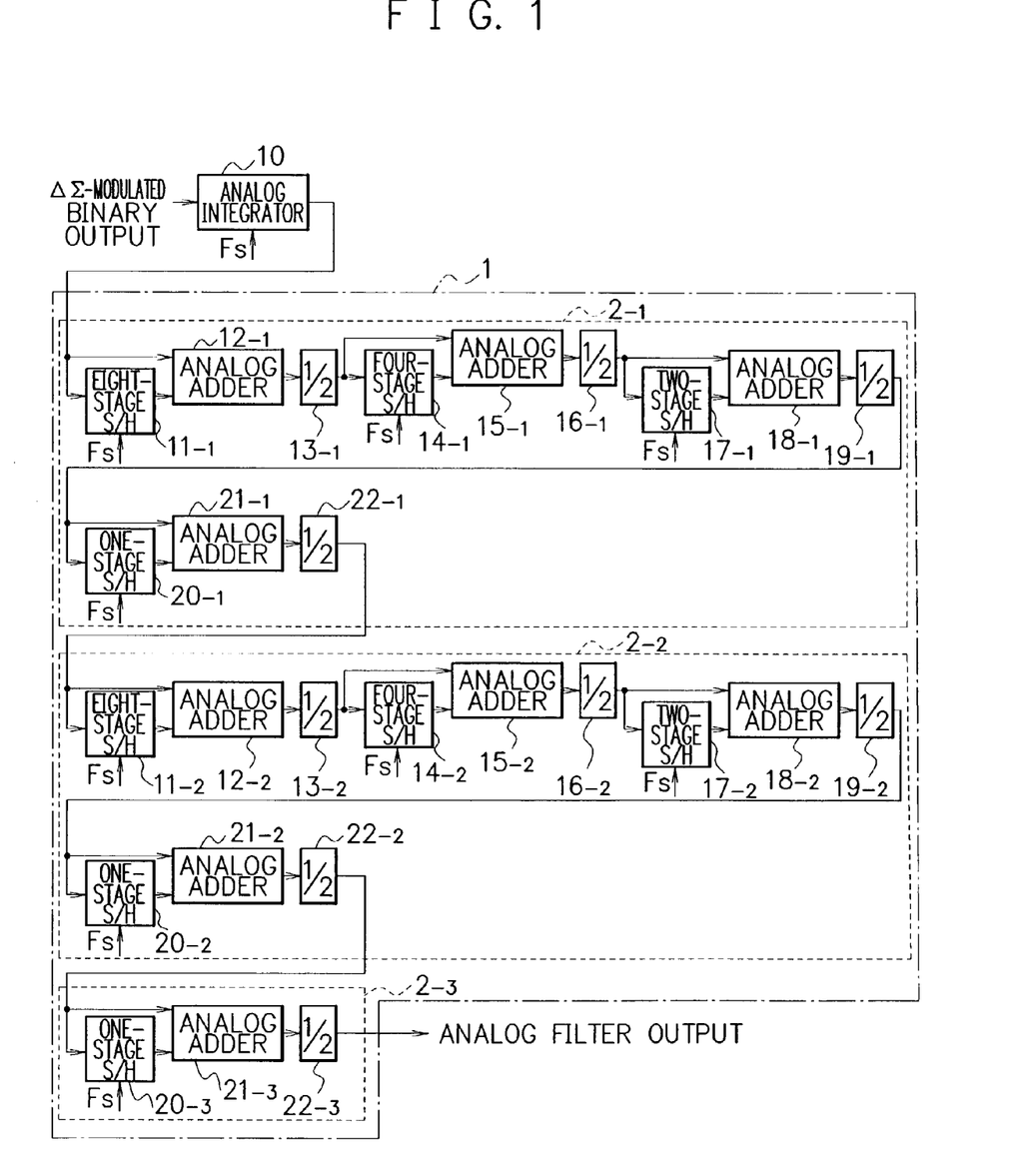
FIG. 1 is a block diagram showing one configuration example of an analog filter according to a first embodiment of the present invention.
Figure 2A:
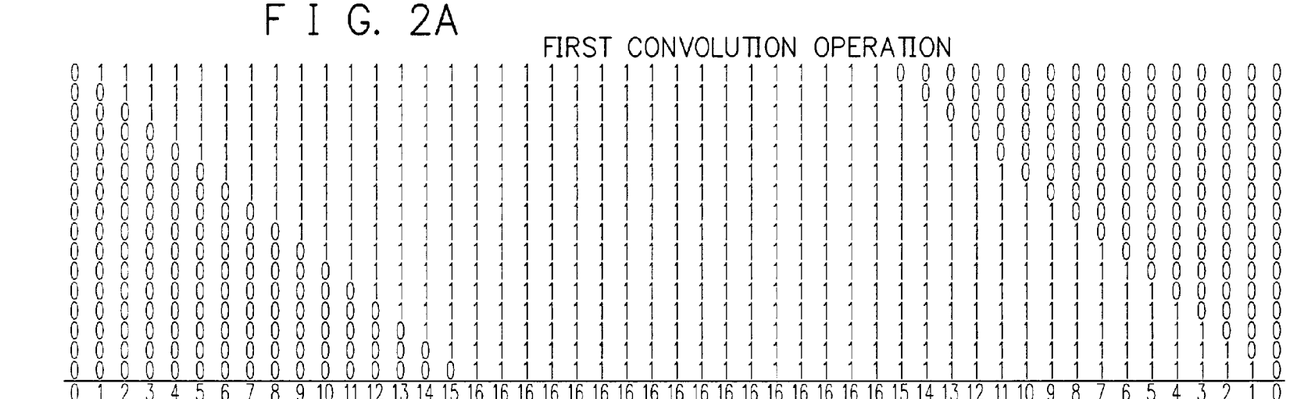
FIGS. 2A, 2B and 2C are diagrams for explaining an operation principle of the analog filter according to the first embodiment of the invention, and especially showing a process of performing the convolution operation.
Figure 2B:
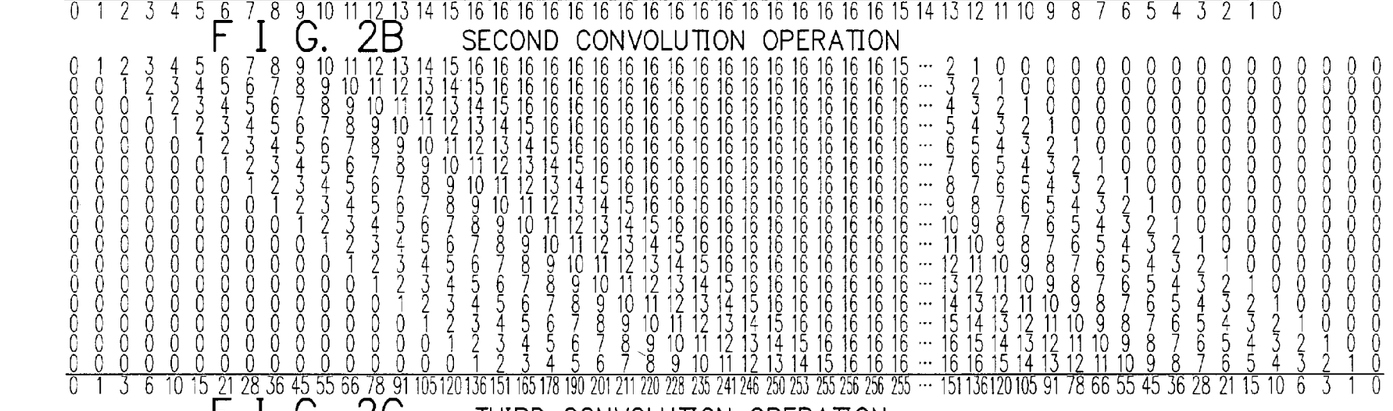
Figure 2C:
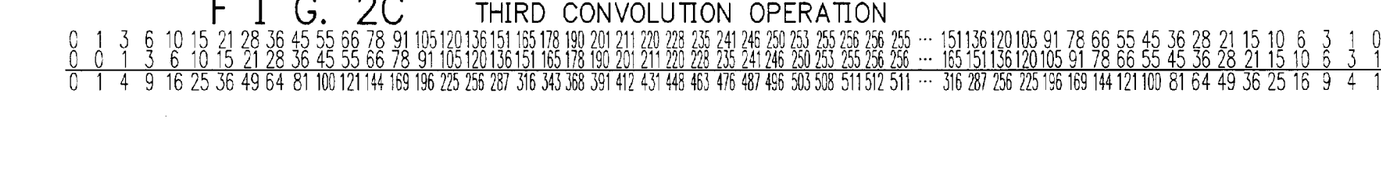
Figure 3A:
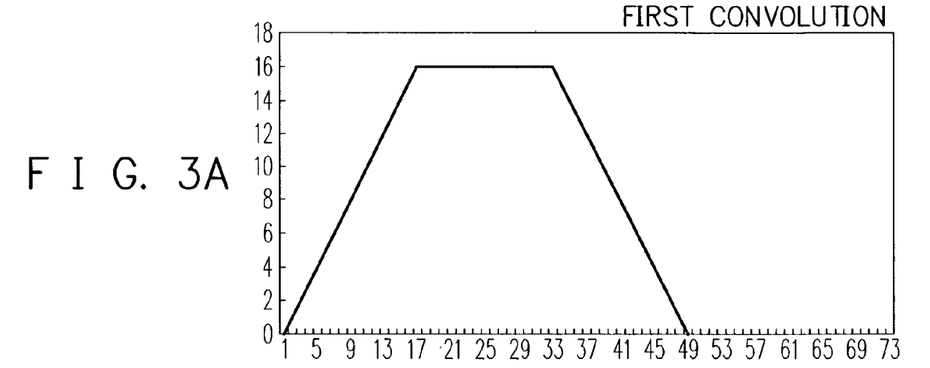
FIGS. 3A, 3B and 3C are diagrams for explaining the operation principle of the analog filter according to the first embodiment of the invention, and especially showing the waveforms obtained through the process of performing the convolution operation.
Figure 3B:
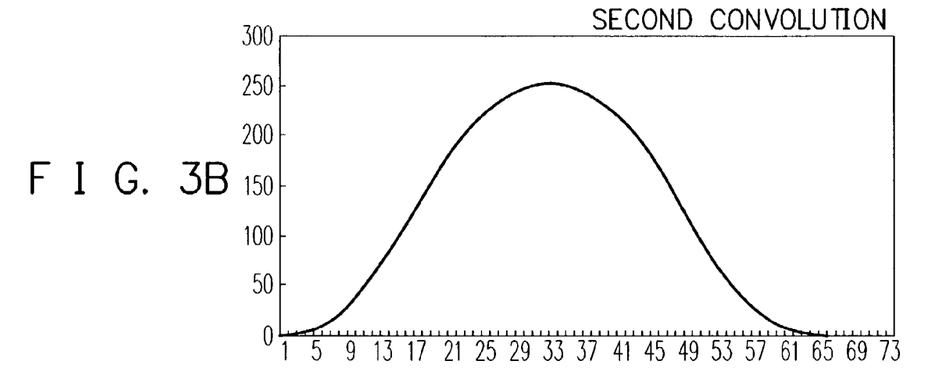
Figure 3C:
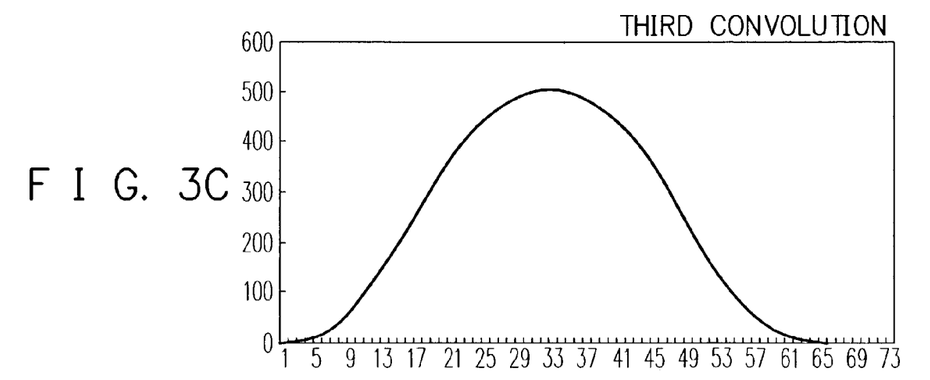

FIG. 1 is a block diagram showing one configuration example of the analog filter according to this embodiment. FIG. 2 and FIG. 3 are diagrams for explaining an operation principle of the analog filter according to this embodiment. First of all, the operation principle will be described below using FIG. 2 and FIG. 3.

FIG. 2 and FIG. 3 show a process of converting a single rectangular wave having a time width of 2nT (n=16 in FIG. 2) and an amplitude 1 into an analog signal, with a unit time determined by a sampling frequency f being T (=1/f).

FIG. 2A shows a processed example of over-sampling in 2n times and the first convolution operation. A sequence of numerical values as listed in the top line in FIG. 2A show the single rectangular wave having time width of 2nT and amplitude 1. If this rectangular wave is shifted by time T and added n times, a symmetrical trapezoidal wave having the upper side (n+1)T, lower side (3n−1)T, and height n is produced, as shown in FIG. 3A.

That is, 16 lines of numerical values listed downward successively from the top line in FIG. 2A are obtained by shifting the row of numerical values indicated at the top line to the right one by one. The row direction of FIG. 2 indicates the time axis, and shifting the row of numerical values to the right corresponds to delaying the row of numerical values listed at the top line by time T successively. Also, the row of numerical values in the seventeenth line from the top are values obtained by adding the rows of numerical values in the first to sixteenth lines in each column. This row of numerical values in the seventeenth line indicates a symmetrical trapezoidal wave of FIG. 3A.

FIG. 2B shows a processed example of the second convolution operation. A sequence of numerical values as listed in the top line in FIG. 2B show the symmetrical trapezoidal wave obtained as a result of the first convolution operation as shown in FIG. 2A. If this symmetrical trapezoidal wave is further shifted by time T and added n times, a continuous quadratic curve having the width (4n+1)T and the amplitude $n^2$ is produced, as shown in FIG. 3B.

FIG. 2C shows a processed example of the third convolution operation. A sequence of numerical values as listed in the top line in FIG. 2C show the quadratic curve obtained as a result of the second convolution operation as shown in FIG. 2B. If this quadratic curve is further shifted by time T and added once, a continuous quadratic curve having the width (4n+1)T and the amplitude $2n^2$ is produced, as shown in FIG. 3C.

A function as shown in FIG. 3C is differentiable once over the entire area, and is a finite carrier having a finite value other than zero, when the sampling position t lies from 1 to 65 along the transverse axis, and having zero value in all other areas. Also, the function of FIG. 3C has a feature of taking the maximal value at the sampling point t=33 alone.

The amplitude of the quadratic curve as shown in FIG. 3C divided by $2n^2$ is an envelope of the filter output. When the discrete data of ΔΣ-modulated signal is input into the analog filter operating in this manner, quadratic curves having the amplitudes proportional to a series of discrete input values are synthesized, each shifted by time 2nT, so that the filter output becomes a smooth quadratic interpolation curve passing respective input values.

Since the sinc function as conventionally employed converges to zero when the sampling point t goes to ±∞, to obtain correctly an interpolated value at a certain interpolation position, it was required to acquire and synthesize the sinc function waves proportional to the discrete data till t=±∞. On the contrary, the function of FIG. 3C used as the envelope of the filter output in this embodiment converges to zero at the sampling point t=1, 65, there is a need for taking into consideration only the discrete data within a range of t from 1 to 65.

Accordingly, if one interpolated value is acquired, it is needed to take into consideration only a limited number of discrete data values, resulting in the smaller processing amount. The discrete data outside a range from t=1 to 65 is not ignored in view of the processing amount or precision, though it should be essentially considered, but is not theoretically required to consider, causing no discretization error.

Figure 4:
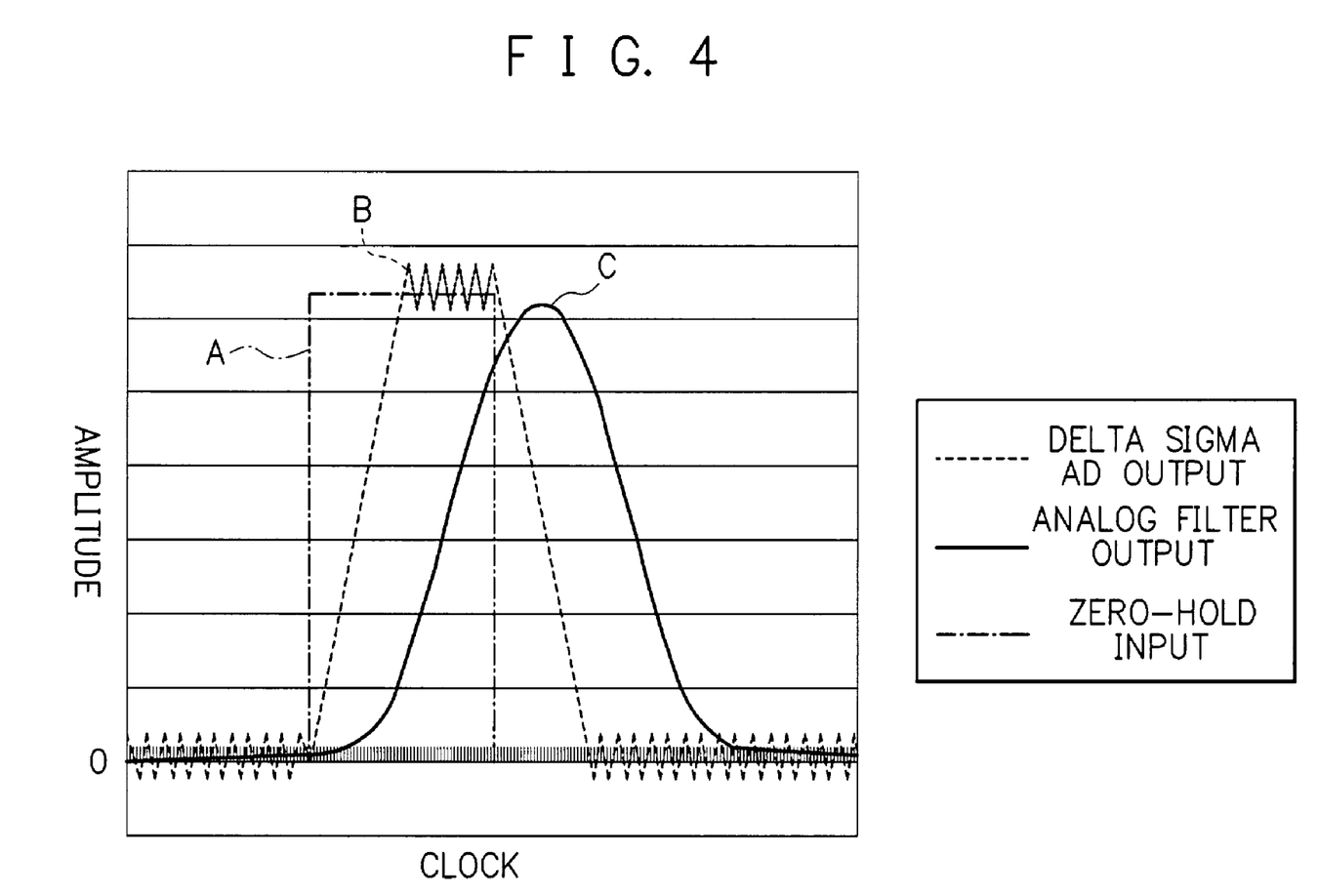
FIG. 4 is a diagram showing the waveforms in which a single rectangular wave is $\Delta\Sigma$-modulated, and a $\Delta\Sigma$-modulated signal is passed through the analog filter.

FIG. 4 is a diagram showing the waveforms in which a single rectangular wave is ΔΣ-modulated, and a ΔΣ-modulated signal is passed through the analog filter. In FIG. 4, graph A represents a rectangular wave generated by the zero-order hold of a certain analog signal. If this rectangular wave is ΔΣ-modulated, a waveform like graph B results. Furthermore, if this waveform of graph B is passed through the analog filter process, a smooth analog waveform like graph C results. This waveform is almost identical to the waveform of the original analog signal.

A configuration example of the analog filter to implement the operation principle will be described below. In FIG. 1, an analog integrator 10 performs the analog integration of a ΔΣ-modulated binary signal (one bit signal) that is input. That is, since the ΔΣ-modulated signal is encoded from a variation in the immediately preceding data as described above, the data of variation at each sampling point is converted into the absolute amount of data by integration. This analog integrator 10 operates in accordance with the clock of frequency Fs that is 2n times the reference sampling frequency f to perform the over-sampling of 2n times.

An analog filter 1 of this embodiment performs the convolution operation for the output signal of the analog integrator 10. As shown in FIG. 1, the analog filter 1 of this embodiment comprises a first convolution operation section $2_{-1}$ for making the 16-stage convolution operation (first convolution operation as shown in FIG. 2A), a second convolution operation section $2_{-2}$ for making the 16-stage convolution operation (second convolution operation as shown in FIG. 2B), and a third convolution operation section $2_{-3}$ for making the two-stage convolution operation (third convolution operation as shown in FIG. 2C).

The first convolution operation section $2_{-1}$ comprises the following constitutions $11_{-1}$ to $22_{-1}$. An eight-stage sample hold (S/H) circuit $11_{-1}$ provided on the most input side of the first convolution operation section $2_{-1}$ holds the output signal of the analog integrator 10 successively in accordance with the clock of frequency Fs. Namely, the signal input into the eight-stage S/H circuit $11_{-1}$ is delayed by time $T_1$=8/Fs and then output. An analog adder $12_{-1}$ adds the input and output signals of the eight-stage S/H circuit $11_{-1}$. A ½ divider $13_{-1}$ divides by two the output signal of the analog adder $12_{-1}$. A set of processing circuit is made up of the eight-stage S/H circuit $11_{-1}$, the analog adder $12_{-1}$ and the ½ divider $13_{-1}$.

A four-stage S/H circuit $14_{-1}$ holds the output signal of the ½ divider $13_{-1}$ successively in accordance with the clock of frequency Fs. Namely, the signal input into the four-stage S/H circuit $14_{-1}$ is delayed by time $T_2$=4/Fs and then output. An analog adder $15_{-1}$ adds the input and output signals of the four-stage S/H circuit $14_{-1}$. A ½ divider $16_{-1}$ divides by two the output signal of the analog adder $15_{-1}$.

A two-stage S/H circuit $17_{-1}$ holds the output signal of the ½ divider $16_{-1}$ successively in accordance with the clock of frequency Fs. Namely, the signal input into the two-stage S/H circuit $17_{-1}$ is delayed by time $T_3$=2/Fs and then output. An analog adder $18_{-1}$ adds the input and output signals of the two-stage S/H circuit $17_{-1}$. A ½ divider $19_{-1}$ divides by two the output signal of the analog adder $18_{-1}$.

A one-stage S/H circuit $20_{-1}$ holds the output signal of the ½ divider $19_{-1}$ successively in accordance with the clock of frequency Fs. Namely, the signal input into the one-stage S/H circuit $20_{-1}$ is delayed by time $T_4$=1/Fs and then output. An analog adder $21_{-1}$ adds the input and output signals of the one-stage S/H circuit $20_{-1}$. A ½ divider $22_{-1}$ divides by two the output signal of the analog adder $21_{-1}$.

The second convolution operation section $2_{-2}$ comprises the same constitutions $11_{-2}$ to $22_{-2}$ as those of the first convolution operation section $2_{-1}$. Namely, the same numerals with different subscripts designate the corresponding constitutions. The second convolution operation section $2_{-2}$ performs the same processing for the output signal of the first convolution operation section $2_{-1}$ as the first convolution operation section $2_{-1}$.

The third convolution operation section $2_{-3}$ comprises the same constitutions, namely, a one-stage S/H circuit $20_{-3}$, an analog adder $21_{-3}$ and a ½ divider $22_{-3}$, as the last stage of the constitutions $11_{-1}$ to $22_{-1}$ provided for the first convolution operation section $2_{-1}$. Also herein, the same numerals with different subscripts designate the corresponding constitutions. The third convolution operation section $2_{-3}$ performs the same processing for the output signal of the second convolution operation section $2_{-2}$ as the last stage of the first convolution operation section $2_{-1}$.

In this manner, in the first convolution operation section $2_{-1}$ for example, four analog adders and four S/H circuits that are different in the number of stages are cascade connected, thereby repeating a processing of sampling and holding the addition output at the former stage is S/H, and adding the input and output signals of the S/H circuit as two inputs at the latter stage. Thus, the same arithmetic operation can be made as shifting the input wave by time T and adding it $2^4=16$ times.

Similarly, in the second convolution operation section $2_{-2}$, the same arithmetic operation can be also made as shifting the input wave by time T and adding it $2^4=16$ times. In the third convolution operation section $2_{-3}$, the same arithmetic operation can be also made as shifting the input wave by time T and adding it once in one analog adder.

Accordingly, a row of numerical values in which a series of ΔΣ-modulated waves are convoluted and synthesized are produced successively by passing the integral value of the ΔΣ-modulated signal through the analog filter 1 operating in the above manner. The analog waveform determined by this row of numerical values has the amplitude multiplied by $½n^2$ times in a plurality of ½ dividers and has the same amplitude as the original amplitude.

Figure 5:
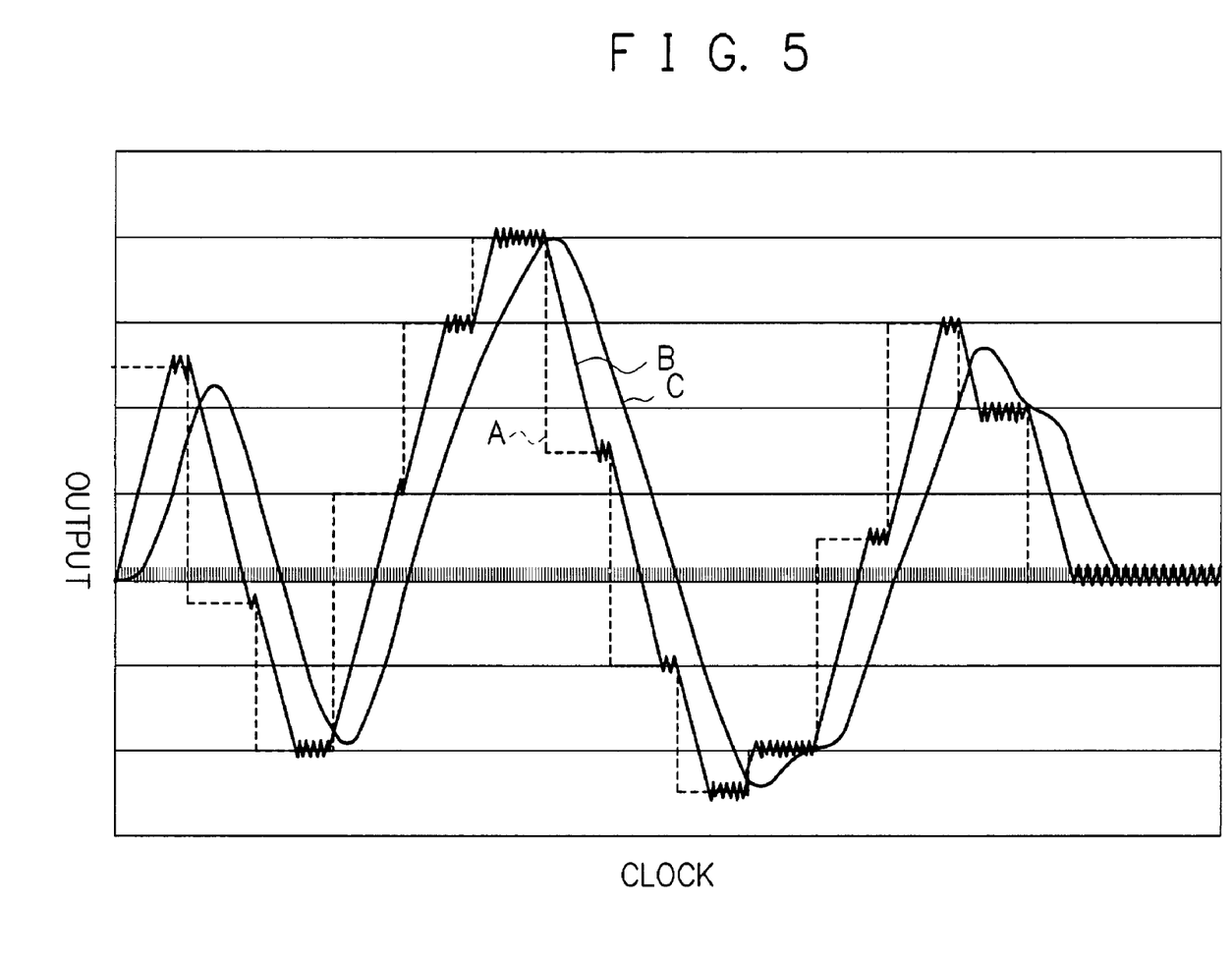
FIG. 5 is a diagram showing the waveform examples obtained as a result of making the $\Delta\Sigma$-modulation and analog filter processing for a digital signal that is the zero-order hold of a certain analog signal.

FIG. 5 is a diagram showing the waveforms obtained as a result of making the ΔΣ-modulation and analog filter processing for a digital signal that is the zero-order hold of a certain analog signal. In FIG. 5, graph A represents a waveform of the digital signal that is the zero-order hold, graph B represents a waveform of the ΔΣ-modulated signal, and graph C represents a waveform of the analog signal after the analog filter processing. The analog waveform as represented by graph C is a smooth waveform almost identical to that of the original analog signal.

As described above, using the analog filter 1 of this embodiment, over-sampling and convolution of a ΔΣ-modulated signal according to the principle as described in connection with FIG. 2 are conducted to perform interpolation so that the envelope of the filter output may be the waveform, as shown in FIG. 3C, converging to zero at the finite sampling points to prevent phase distortion of a low pass filter and a discretization error due to the sinc function, thereby reproducing a smooth analog signal with less distortion in the output waveform.

Also, in the analog filter 1 of this embodiment, a multistage convolution circuit is made up of an S/H circuit having the number of stages decreasing toward the end of each arithmetic operation section like 8-stage, 4-stage, 2-stage and 1-stage, an analog adder for adding the input and output signals of the S/H circuit, and a ½ dividers for dividing by two the output signal of the analog adder.

With a conventional circuit for the convolution operation as shown in FIG. 2, for example, the first convolution operation alone needs S/H circuits of 512 (=16×32) stages and fifteen analog adders, but the first convolution operation section $2_{-1}$ as shown in FIG. 1 is met with S/H circuits of 15 (=8+4+2+1) stages and four analog adders. Also, the second convolution operation section $2_{-2}$ is met with S/H circuits of 15 stages and four analog adders, and the third convolution operation section $2_{-3}$ is met with S/H circuits of one stage and one analog adder. Thereby, the number of stages of the S/H circuits and the number of analog adders are much smaller compared with the conventional circuit, resulting in simplified constitution.

Figure 6:
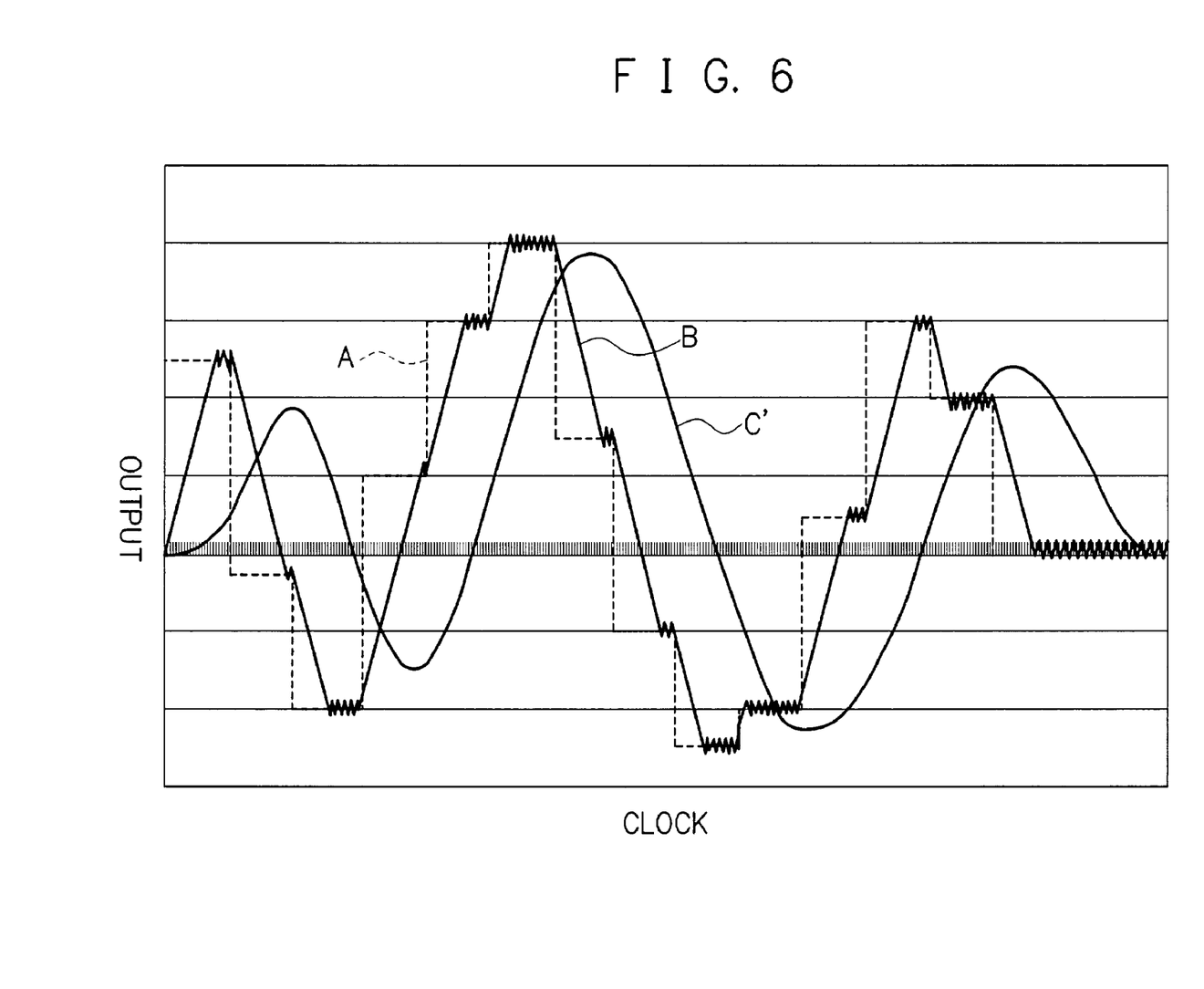
FIG. 6 is a diagram showing another waveform examples obtained as a result of making the $\Delta\Sigma$-modulation and analog filter processing for a digital signal that is the zero-order hold of a certain analog signal.

For reference, a waveform obtained in making the over-sampling in 64 times and convolution of 32 stages is shown in FIG. 6. In FIG. 6, graph A represents a waveform of digital signal that is the zero-order hold, and graph B represents a waveform of the ΔΣ-modulated signal, in which these graphs are the same as shown in FIG. 5. Graph C' represents a waveform of the analog signal after the analog filter processing. The analog waveform as represented in graph C' of FIG. 6 is simpler with high frequency components removed, as compared with the analog waveform as represented in graph C of FIG. 5. If laying stress on the reproducibility of the original analog signal, depending on the usage of the filter, the waveform of FIG. 5 is preferable.

Second Embodiment

A second embodiment of the invention will be described below.

An analog filter according to the second embodiment of the invention provides an analog signal having a smoother waveform by weighting a ΔΣ-modulated binary signal (one bit signal) with a digital fundamental waveform corresponding to a predetermined sampling function as described below, and performing the convolution operation as described in the first embodiment on its output signal.

Figure 7:
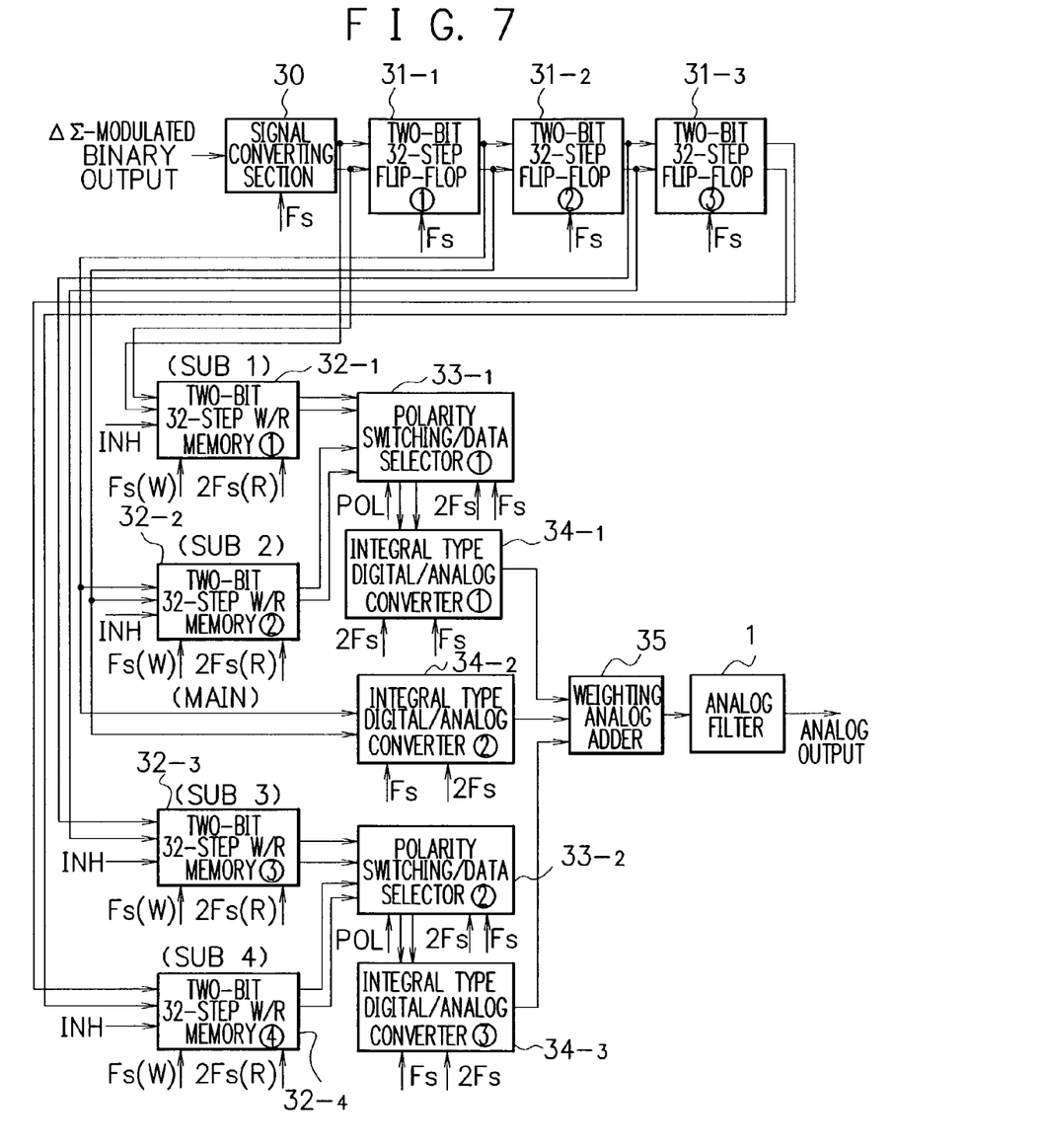
FIG. 7 is a block diagram showing one configuration example of an analog filter according to a second embodiment of the invention.
Figure 9:
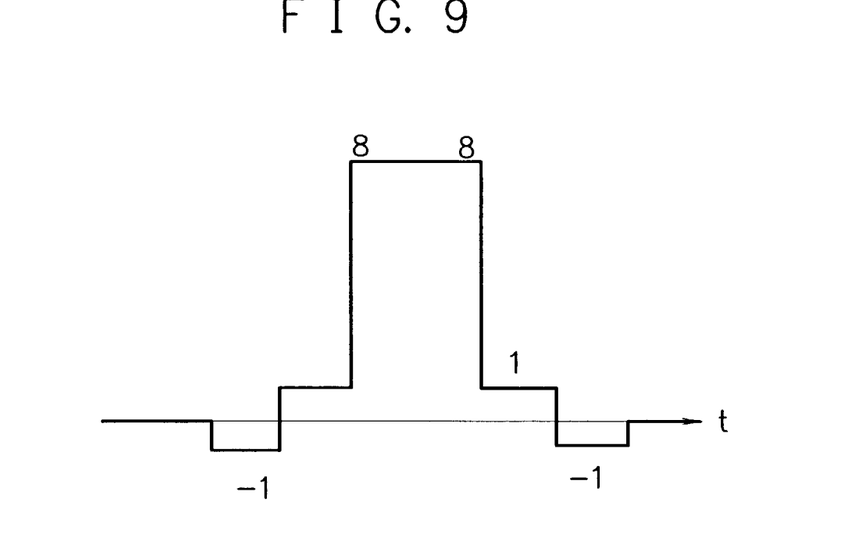
FIG. 9 is a diagram showing a digital fundamental waveform to be used in the second embodiment of the invention.
Figure 10:
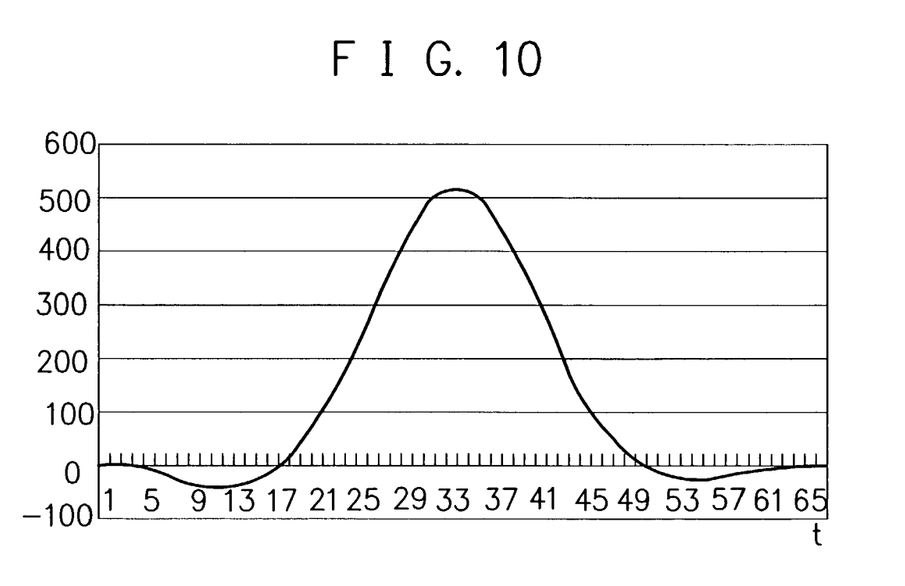
FIG. 10 is a diagram showing a sampling function generated from the digital fundamental waveform of FIG. 9.

FIG. 7 is a block diagram showing one configuration example of the analog filter according to this embodiment, and FIG. 8 is a timing chart showing the operation timing. Also, FIG. 9 is a diagram showing the digital fundamental waveform, and FIG. 10 is a graph representing a waveform obtained as a result of passing the digital fundamental waveform through the analog filter. First of all, the operation principle will be described below using FIG. 9 and FIG. 10.

A digital fundamental waveform as shown in FIG. 9 is fundamental for a sampling function useful in making the analog filter processing of this embodiment. This digital fundamental waveform is produced by changing the data value such as −1, 1, 8, 8, 1 and −1 at every clock of a frequency Fs that is a multiple of a reference sampling frequency f. Though the operation process is not shown in the figure, if over-sampling and convolution for this digital fundamental waveform are conducted, as described above and shown in FIG. 2, its output waveform is shown in FIG. 10.

The function of FIG. 10, like the function of FIG. 3C, is differentiable once over the entire area, and is a finite carrier having a finite value other than zero, when the sampling position t lies from 1 to 65 along the transverse axis, and having zero value in all other areas. Also, the function of FIG. 10 has a feature of taking the maximal value at the sampling point t=33 alone, and zero at four sampling points t=1, 17, 49 and 65, and passes all the sampling points required to obtain a smooth analog waveform signal.

In this way, the function of FIG. 10 is a sampling function of finite carrier that is differentiable once over the entire area, and converges to zero at the sampling positions t=1, 65. Accordingly, the sampling function of FIG. 10 is used as the envelope of the filter output and superposed on individual discrete data of ΔΣ-modulated signal, whereby the value between individual discrete data can be interpolated employing the first-order differentiable function. Because of no discretization error, a distortion in the output waveform can be prevented.

A configuration example of the analog filter to implement the operation principle will be described below. In FIG. 7, a signal converting section 30 converts a ΔΣ-modulated binary signal (one bit signal) into a differential digital signal of two bits. This signal converting section 30 operates in accordance with the clock of the frequency Fs that is a multiple of the reference sampling frequency f. At the output stage of the signal converting section 30, there are provided three flip-flops $31_{-1}$, $31_{-2}$ and $31_{-3}$. Each of three flip-flops $31_{-1}$, $31_{-2}$ and $31_{-3}$ comprises 32 stages of flip-flops for holding the two-bit differential digital signal successively in accordance with the clock of frequency Fs, whereby the input signal is delayed by time $T_0$=32/Fs and output.

Four read/write memories $32_{-1}$, $32_{-2}$, $32_{-3}$ and $32_{-4}$ are connected to the output taps of the signal converting section 30 and the flip-flops $31_{-1}$, $31_{-2}$ and $31_{-3}$, respectively. That is, a first read/write memory $32_{-1}$ is connected to an output tap of the signal converting section 30, a second read/write memory $32_{-2}$ is connected to an output tap of the first flip-flop $31_{-1}$, a third read/write memory $32_{-3}$ is connected to an output tap of the second flip-flop $31_{-2}$, and a fourth read/write memory $32_{-4}$ is connected to an output tap of the third flip-flop $31_{-3}$.

Each of the read/write memories $32_{-1}$, $32_{-2}$, $32_{-3}$ and $32_{-4}$ has an area of the capacity for storing 32 steps of the two-bit differential digital signal, whereby the input differential digital signal is written in accordance with the clock of the frequency Fs, and read in accordance with the clock of double frequency 2Fs.

Two polarity switching/data selectors $33_{-1}$ and $33_{-2}$ are provided at the output stages of the read/write memories $32_{-1}$, $32_{-2}$, $32_{-3}$ and $32_{-4}$. That is, a first polarity switching/data selector $33_{-1}$ is connected to the output stages of the first and second read/write memories $32_{-1}$ and $32_{-2}$, and a second polarity switching/data selectors $33_{-2}$ is connected to the output stages of the third and fourth read/write memories $32_{-3}$ and $32_{-4}$.

Each of the polarity switching/data selectors $33_{-1}$ and $33_{-2}$ switches the positive or negative polarity of the differential digital signal input from two read/write memories at predetermined timing, and selects any signal for output. The signal output from each of the polarity switching/data selectors $33_{-1}$ and $33_{-2}$ is input into the first and third integral type digital/analog converters $34_{-1}$ and $34_{-3}$ for making the A/D conversion, which has the integral effect.

Each of the first and third integral type digital/analog converters $34_{-1}$ and $34_{-3}$ converts the differential digital signal output from the first and second polarity switching/ data selectors $33_{-1}$ and $33_{-2}$ into analog signal. Also, a second integral type digital/analog converter $34_{-2}$ converts the differential digital signal output from the first flip-flop $31_{-1}$ into analog signal.

FIG. 8 is a timing chart showing the operation timing for processing the input ΔΣ-modulated signal and inputting the differential digital signal into three integral type digital/ analog converters $34_{-1}$, $34_{-2}$ and $34_{-3}$.

Figure 8A:
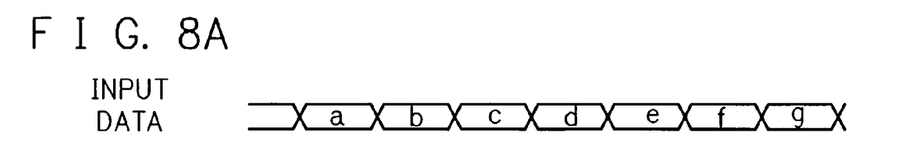
FIGS. 8A, 8B, 8C, 8D, 8E and 8F are timing charts showing the operation timing of the analog filter according to the second embodiment of the invention.
Figure 8B:
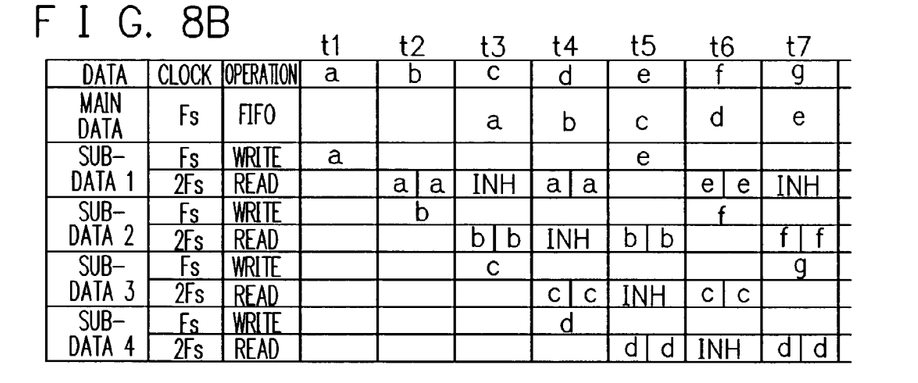

FIG. 8A is a chart showing an example of the input data. Herein, it is supposed that the data rows a to g are input in sequence (a to g indicate the amplitude.) FIG. 8B is a diagram showing the read and write timings for the main data and the sub-data 1 to 4. Herein, the main data means the data output from the first flip-flop $31_{-1}$, to the second integral type digital/analog converter $34_{-2}$, and the sub-data 1 to 4 mean the data input or output into or from the read/write memories $32_{-1}$, $32_{-2}$, $32_{-3}$ and $32_{-4}$, respectively.

Figure 8C:
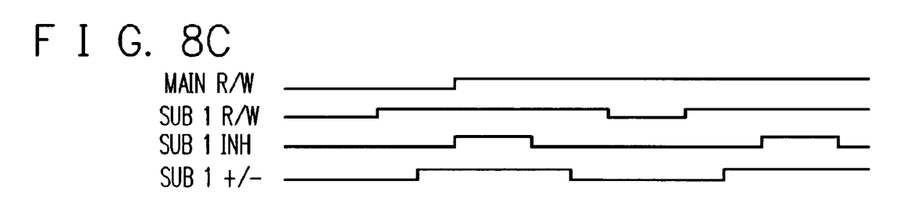

As shown in FIG. 8B and FIG. 8C, data a is written into the first read/write memory $32_{-1}$ at time t1 in accordance with the clock of frequency Fs, read twice from the first read/write memory $32_{-1}$ at next time t2 in accordance with the clock of double frequency 2Fs, and input as the sub-data 1 into the first polarity switching/data selector $33_{-1}$.

At next time t3, a signal INH is input into the first read/write memory 321 and the input/output of data is suspended. Also, at the time t3, data a with delay is read from the first flop-flop $31_{-1}$, and input as the main data into the second integral type digital/analog converter $34_{-2}$. And at next time t4, data a is read twice from the first read/write memory $32_{-1}$ in accordance with the clock of double frequency 2Fs, and input as the sub-data 1 into the first polarity switching/data selector $33_{-1}$.

Thereby, data a is input into the first polarity switching/ data selector $33_{-1}$ four times at time from t2 to t4 in accordance with the clock of double frequency 2Fs. Then, the first polarity switching/data selector $33_{-1}$, reverses the polarity for the data a input at the second and third times, and outputs its result to the first integral type digital/analog converter $34_{-1}$. Thereby, data a is input into the first integral type digital/analog converter $34_{-1}$, in the sequence of –a, a, a and –a.

Figure 8D:
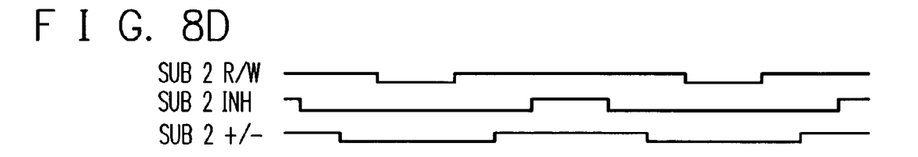

As shown in FIG. 8B and FIG. 8D, data b is written into the second read/write memory $32_{-2}$ at time t2 in accordance with the clock of frequency Fs, read twice from the second read/write memory $32_{-2}$ at next time t3 in accordance with the clock of double frequency 2Fs, and input as the sub-data 2 into the first polarity switching/data selector $33_{-1}$.

At next time t4, signal INH is input into the second read/write memory $32_{-2}$, and the input/output of data is suspended. Also, at the time t4, data b with delay is read from the first flop-flop $31_{-1}$, and input as the main data into the second integral type digital/analog converter $34_{-2}$. And at next time t5, datab is read twice from the second read/write memory $32_{-2}$ in accordance with the clock of double frequency 2Fs, and input as the sub-data 2 into the first polarity switching/data selector $33_{-1}$.

Thereby, data b is input into the first polarity switching/ data selector $33_{-1}$, four times at time from t3 to t5 in accordance with the clock of double frequency 2Fs. Then, the first polarity switching/data selector $33_{-1}$ reverses the polarity for the data b input at the second and third times, and outputs its result to the first integral type digital/analog converter $34_{-1}$. Thereby, data b is input into the first integral type digital/analog converter $34_{-1}$ in the sequence of –b, b, b and –b.

Figure 8E:
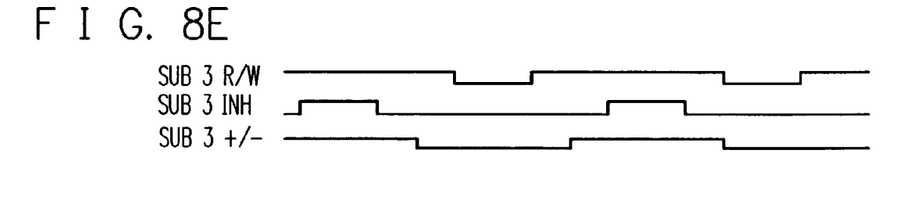

As shown in FIG. 8B and FIG. 8E, data c is written into the third read/write memory $32_{-3}$ at time t3 in accordance with the clock of frequency Fs, read twice from the third read/write memory $32_{-3}$ at next time t4 in accordance with the clock of double frequency 2Fs, and input as the sub-data 3 into the second polarity switching/data selector $33_{-2}$.

At next time t5, signal INH is input into the third read/write memory $32_{-3}$, and the input/output of data is suspended. Also, at the time t5, data c with delay is read from the first flop-flop $31_{-1}$, and input as the main data into the second integral type digital/analog converter $34_{-2}$. And at next time t6, data c is read twice from the third read/write memory $32_{-3}$ in accordance with the clock of double frequency 2Fs, and input as the sub-data 3 into the second polarity switching/data selector $33_{-2}$.

Thereby, data c is input into the second polarity switching/ data selector $33_{-2}$ four times at time from t4 to t6 in accordance with the clock of double frequency 2Fs. Then, the second polarity switching/data selector $33_{-2}$ reverses the polarity for the data c input at the second and third times, and outputs its result to the third integral type digital/analog converter $34_{-3}$. Thereby, data c is input into the third integral type digital/analog converter $34_{-3}$ in the sequence of –c, c, c and –c.

Figure 8F:
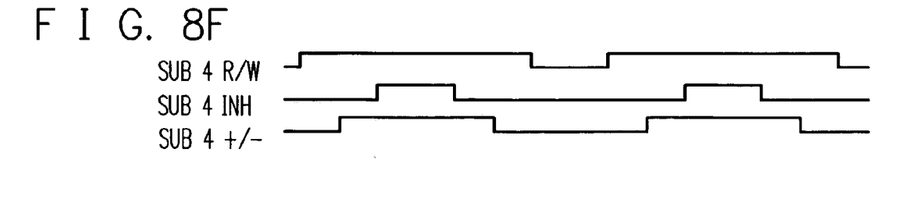

As shown in FIG. 8B and FIG. 8F, data d is written into the fourth read/write memory $32_{-4}$ at time t4 in accordance with the clock of frequency Fs, read twice from the fourth read/write memory $32_{-4}$ at next time t5 in accordance with the clock of double frequency 2Fs, and input as the sub-data 4 into the second polarity switching/data selector $33_{-2}$.

At next time t6, signal INH is input into the fourth read/write memory $32_{-4}$, and the input/output of data is suspended. Also, at the time t6, data d with delay is read from the first flop-flop $31_{-1}$, and input as the main data into the second integral type digital/analog converter $34_{-2}$. And at next time t7, data d is read twice from the fourth read/write memory $32_{-4}$ in accordance with the clock of double frequency 2Fs, and input as the sub-data 4 into the second polarity switching/data selector $33_{-2}$.

Thereby, data d is input into the second polarity switching/data selector $33_{-2}$ four times at time from t5 to t7 in accordance with the clock of double frequency 2Fs. Then, the second polarity switching/data selector $33_{-2}$ reverses the polarity for the data d input at the second and third times, and outputs its result to the third integral type digital/analog converter $34_{-3}$. Thereby, data d is input into the third integral type digital/analog converter $34_{-3}$ in the sequence of –d, d, d and –d.

On and after, in the same manner for the data e, f, g, . . . reading and writing the main data and the sub-data 1 to sub-data 4 are performed successively. Also, the polarity switching is made in the same manner.

Through the above process, at the timing of t4, for example, data row a, –a with a period of 2Fs are input into the first integral type digital/analog converter $34_{-1}$, data b with a period of Fs are input into the second integral type digital/analog converter $34_{-2}$, and data row–c, c with a period of 2Fs are input into the third integral type digital/analog converter $34_{-3}$.

A weighting analog adder 35 weights and adds the analog signals output from the integral type digital/analog converters $34_{-1}$, $34_{-2}$ and $34_{-3}$. Herein, the output signals from the first integral type digital/analog converter $34_{-1}$, the second integral type digital/analog converter $34_{-2}$ and the third integral type digital/analog converter $34_{-3}$ are weighted at a ratio of 1:8:1.

Thereby, an analog fundamental waveform having the amplitude corresponding to the value of ΔΣ-modulated binary signal is produced. For example, at the timing of t4, an analog waveform coping with a basic digital waveform (–a, a, 8b, 8b, c, –c) having the amplitudes corresponding to the data values a, b and c input into the integral type digital/analog converters $34_{-1}$, $34_{-2}$ and $34_{-3}$ is produced.

The analog filter 1 is connected at the later stage of this weighting analog adder 35. The analog filter 1 is constituted in the same manner as shown in FIG. 1. And the convolution operation as described in the first embodiment is conducted on the fundamental waveform output from the weighting analog adder 35.

As described above, the analog filter 1 of this embodiment makes interpolation so that the envelope of the filter output may be the waveform as shown in FIG. 3C that converges to zero at finite sampling points to prevent phase distortion of a low pass filter and a discretization error due to the sinc function, thereby reproducing the smoother analog signal with less distorted output waveform.

And in this embodiment, as the preprocessing for inputting the ΔΣ-modulated signal into the analog filter 1, the discrete data of the ΔΣ-modulated signal is processed in accordance with the basic digital waveform that is the reference of the sampling function of finite carrier as shown in FIG. 10, whereby the smoother analog signal can be reproduced. Accordingly, if this is applied to the voice reproducing apparatus, the smooth and extensive reproduced audio sound can be produced, unlike the normal CD reproduction.

In the above embodiment, as an example of the convolution operation, after the 16-stage convolution operation is conducted twice, two-stage convolution operation is conducted. However, this invention is not limited to the above example. For example, the 16-stage convolution operation may be conducted twice, and the last two-stage convolution operation may be omitted, thereby producing relatively smooth analog waveform. Also, the two-stage convolution operation may be conducted three times, and the eight-stage convolution operation may be conducted once. Thus, a few convolution operations of arbitrary stages may be combined in any form.

In the above embodiment, the ½ divider is provided at each of the output stages of plural analog adders, but a few or all ½ dividers maybe provided collectively at one region. For example, one ¹⁄₁₆ divider may be provided at each of the last stages of the first and second convolution operation sections $2_{-1}$ and $2_{-2}$, or one $½n^2$ divider may be provided at the last stage of the third convolution operation section $2_{-3}$. In this case, a set of processing circuit is made up of the S/H circuit and the analog adder.

In the above embodiment, a set of processing circuit consists of a circuit having the S/H circuits of $2^i$ stages and the analog adders, j sets of processing circuit are connected in cascade, and the number of stages for the S/H circuits of $2^i$ stages gradually decreases toward the end of each arithmetic operation section such as i=j–1, j–2, . . . , 1, 0. This invention is not limited to this example. For example, the number of stages for the S/H circuits of $2^i$ stages may gradually increase toward the end of each arithmetic operation section such as i=0, 1, . . . , j–2, j–1, or the S/H circuits may be randomly disposed.

It is to be understood that the invention is not limited to the exact details of construction, operation, exact materials, or embodiments shown and described, as various modifications and equivalents will be made without departing from the spirit and scope of the invention.

[Industrisl Applicability]

This invention is beneficial to implement an optimal analog filter for the ΔΣ-modulated output, or an analog filter with less distortion in the output waveform and of a simple construction.

What is claimed is:

1. An analog filter comprising: a first arithmetic operation section for performing moving average operation or convolution operation on individual ΔΣ-modulated discrete data to perform interpolation so that the envelope of the output waveform may be a symmetrical trapezoidal wave; and a second arithmetic operation section for performing moving average operation or convolution operation on individual discrete data of said symmetrical trapezoidal wave obtained in said first arithmetic operation section to perform interpolation, so that the envelope of the output waveform may be a quadratic curve wave passing the sample values of individual ΔΣ-modulated discrete data; characterized in that each of said first arithmetic operation section and said second arithmetic operation section has a circuit composed of a sample hold circuit of plural stages for holding a signal, an adder for adding the input and output signals of the sample hold circuit of plural stages, and a ½ divider for dividing by two the output signal of said adder, as one set of processing circuit, a plurality of sets of processing circuit being cascade connected, and said sample hold circuit of plural stages provided for said plurality of sets of processing circuit has a different number of stages.

2. The analog filter according to claim 1, characterized in that the number of stages of the sample hold circuit of plural stages provided for said plurality of sets of processing circuit decreases toward the end of said cascade connection in each of said first arithmetic operation section and said second arithmetic operation section.

3. The analog filter according to claim 1, characterized by further comprising a preprocessing section for preprocessing individual ΔΣ-modulated discrete data according to a digital fundamental waveform that is the basis of a sampling function of finite carrier that converges to zero at finite sampling points to conduct the moving average operation or convolution operation on the output signal of said preprocessing section.

4. An analog filter, comprising:

a first arithmetic operation section having a circuit composed of a sample hold circuit of $2^i$ stages for holding a signal, an adder for adding the input and output signals of said sample hold circuit of $2^i$ stages, and a ½ divider for dividing by two the output signal of said adder, as one set of processing circuit, j sets of processing circuit being cascade connected, the number of stages of said sample hold circuit of 2i stages provided for said sets of processing circuit being i=j−1, j−2, . . . , 1, 0;

a second arithmetic operation section configured in the same way as said first arithmetic operation section, wherein said first arithmetic operation section and said second arithmetic operation section are cascade connected; and a sample hold circuit of one stage for holding an output signal of said second arithmetic operation section, an adder for adding the input and output signals of said sample hold circuit of one stage, and a ½ divider for dividing by two the output signal of said adder.

* * * * *